United States Patent [19]

Ferris

[11] 4,311,927
[45] Jan. 19, 1982

[54] TRANSISTOR LOGIC TRISTATE DEVICE WITH REDUCED OUTPUT CAPACITANCE

[75] Inventor: David A. Ferris, West Buxton, Me.

[73] Assignee: Fairchild Camera & Instrument Corp., Mountain View, Calif.

[21] Appl. No.: 58,674

[22] Filed: Jul. 18, 1979

[51] Int. Cl.³ ............................................. H03K 19/088
[52] U.S. Cl. ........................................ 307/473; 307/456
[58] Field of Search ............... 307/203, 209, 214, 215, 307/218

[56] References Cited

U.S. PATENT DOCUMENTS

| | | | |
|---|---|---|---|
| 3,602,733 | 8/1971 | Aoki | 307/209 |
| 4,081,695 | 3/1978 | Allen et al. | 307/209 |
| 4,132,906 | 1/1979 | Allen | 307/270 X |

Primary Examiner—John Zazworsky
Attorney, Agent, or Firm—Paul J. Winters; Theodore S. Park; Thomas Langer

[57] ABSTRACT

A transistor logic tristate output gate or device is provided with active or passive element arrangements coupled between the enable gate on the one hand and the base of the pull down element transistor on the other hand. This coupling affords a low impedance route to ground or low potential from the base of the pull down element when the enable gate is at low potential and the output device is in the high impedance third state. Miller feedback current at the base of the pull down element transistor is thereby diverted to ground. The coupling arrangement affords high impedance to current flow in the opposite direction thereby blocking current flow from the enable gate when the enable gate is at high potential. For active discharge of Miller current three transistors are provided in a double inversion series coupling between the enable gate and pull down element. Alternately a multiple emitter junction transistor is used. For passive element discharge of Miller current a low forward impedance high backward impedance large surface area diode is used.

15 Claims, 8 Drawing Figures

(INOPERATIVE)

TRANSISTOR LOGIC TRISTATE DEVICE WITH REDUCED OUTPUT CAPACITANCE

FIELD OF THE INVENTION

This invention relates to new and improved tristate output gates for transistor logic circuits, affording reduced output capacitance in the high impedance third state, and suitable for integrated circuits and applications in which a plurality of such output gates or devices are coupled to a common bus. In particular, the present invention is directed to diverting parasitic Miller capacitance feedback current, caused by low to high potential transistions at the common bus, away from the pull-down element of those transistor logic gates in the high impedance third state thereby avoiding undesirable low impedance episodes.

BACKGROUND OF THE INVENTION

In conventional transistor-transistor logic (TTL) and diode-transistor logic (DTL) tristate devices, logical values corresponding to binary "1" and "0" are ordinarily represented at the output by a high level voltage $V_{oh}$, for example greater than 2.4 volts, and a low level voltage $V_{ol}$, for example less than 0.8 volts. In positive logic, the high level binary "1" is derived from a voltage source $V_{cc}$ which "sources" the current to the output when a binary "1" is to be delivered by the output gate. When a binary "0" is required at the output, the output gate blocks sourcing current and instead "sinks" the current from the outpout load to ground so that the low level voltage $V_{ol}$ appears at the output of the logic gate. The high impedance third state is achieved by diverting base drive current from the elements of the device thru an enable gate so that they are all nonconducting and the output $V_o$ effectively becomes a high impedance to any exterior circuitry. Thus, the typical TTL tristate output gate functions by "sinking" and "sourcing" current at the output according to whether a binary "1" (high level voltage) or a binary "0" (low level voltage) is the desired outcome of previously executed logical operations or by exhibiting a high impedance at the output according to the signal at the enable gate. In negative logic the representation of binary 1 and 0 by high and low level voltage is reversed.

A conventional low power Schottky TTL tristate output device is illustrated in FIG. 1. Several elements or stages can be identified in such a TTL output gate. The "pullup" element for sourcing current from the higher level voltage $V_{cc}$ and delivering binary 1 consists of transistors Q2 and Q3 forming a Darlington transistor pair that can supply a relatively large current between the high level voltage source $V_{cc}$ and the output $V_o$ when a much smaller current is applied to the base of Q2. The "pulldown" element or stage for sinking current from the output to ground consists of transistor Q4 with a conventional squaring network at its base comprised of resistors R3 and R4 and transistor Q5. The phase splitter element or stage consists of transistor Q1 which receives the data signal input to the gate in the form of a high or low level voltage $V_i$ and controls the pullup and pulldown elements for either sourcing or sinking current at the output $V_o$ as determined by the data signal input to the gate.

When a low level voltage or potential appears at the input $V_i$, a low voltage also appears at the base of phase splitter transistor Q1 and this transistor is deprived of base drive current so that it no longer conducts current through its collector to emitter thereby turning off pulldown transistor Q4. Ideally, the output of $V_o$ of the gate is therefore isolated from ground. At the same time, because Q1 is non-conducting, the high level voltage $V_{cc}$ appears at the base of sourcing transistor Q2 supplying base current for transistor Q2 which turns on and supplies current to the base of Q3 which in turn becomes conducting and "sources" amplified current from $V_{cc}$ to the output $V_o$. The TTL logic gate is therefore inherently inverting as a binary 0 at the input $V_i$ represented by a low voltage level generates a binary 1 at the output represented by voltage level $V_{oh}$.

When a binary 1 appears at the input, current supplies base drive to transistor Q1, Q1 becomes conducting, sinking current from the base of Q2 and therefore turning off the Darlington transistor current source represented by transistors Q2 and Q3. Current from high level voltage $V_{cc}$ is therefore no longer sourced to the output $V_o$. At the same time, pulldown transistor Q4 becomes conducting through its collector to emitter to ground as a result of the current supplied to its base and begins to discharge current from whatever load capacitance may be coupled to the output $V_o$ of the gate, bringing the output $V_o$ to a low level potential corresponding to binary 0. While transmitting binary signals, the TTL output is functioning in a bistate mode. A high level potential at the enable gate terminal A "enables" the gate to function in this bistate mode.

As shown in FIG. 1 and in other figures, some of the transistor and diode components are typically Schottky diodes and transistors indicated by the opposite square hooks in the schematic symbols. The Schottky clamping effected by an internal modification in these devices produces quicker turn-off during switching.

The element added in order to create a high impedance third state at $V_o$ is the enable gate at terminal A represented in part by transistor Q9. When the enable gate transistor Q9 is conducting, base current from $V_{cc}$ to the Darlington transistor pullup element Q2 and Q3 is diverted through the enable gate by way of diode D1 to ground. Similarly, the base current of phase splitter transistor Q1 finds a low impedance path to ground through diode D2 and the collector of enable gate transistor Q9. Ordinarily transistor Q9 is non-conducting so that the aforesaid routes to ground are blocked. In this condition, the output gate functions as a bistate output device in the manner described. The enable gate is generally itself a bistate TTL output device where transistor Q9 forms the pulldown element. A high level potential at enable gate terminal A "enables" the output device to transmit binary signals while a low level potential delivered by the enable gate to terminal A sinks current from the elements of the device.

In order to establish a high impedance third state at $V_o$ and node B connected to the common bus, the enable gate is activated by a signal so that it becomes conducting through Q9 to ground delivering a low potential at terminal A. In this state, the enable gate effectively sinks all current at the elements of the output gate including the pullup and phase splitter stages (and therefore indirectly the pulldown element) by providing a direct route to ground. With all of the elements deprived of base current, the output effectively becomes a high impedance to any exterior circuitry coupled to node B on the common bus. In this condition, the gate should neither source nor sink current at the output and will behave preferably as if nothing were there. Further discussions of TTL tristate output devices is found in copending United States patent applications.

Such a tristate device is therefore particularly applicable and suitable for applications in which a plurality of output gates are tied together or coupled to a common bus structure. In such common bus applications only one output, that is only one of the gates coupled to the bus structure, determines the voltage (high or low) of the bus while the other outputs for the remaining gates are in the high impedance third state. Thus, in a typical application, several tri-state devices 11 have their outputs tied together on a common bus or wire 12 which transmits signals to a receiver or receivers 14 as illustrated in FIG. 2. All but one of these devices is in the high impedance (high Z) state. The remaining device 13 is active. When the active device undergoes a low-to-high transition, a problem is encountered. Although the high Z output devices 11 have high DC impedance, they have a relatively low AC impedance. This is because there exists a parasitic junction capacitance between the base and collector of the output transistor Q4 of each device. When the potential at the common bus rises, and the device is in its high Z state, charge is coupled through this base collector capacitance. Since the squaring network looks like a relatively high impedance most of the feed back goes into the base of Q4. This base current becomes amplified by the common-emitter current gain of the transistor to provide a large collector current into Q4. The effect on the output and node B is equivalent to placing a low impedance at this node for the duration of the transition, or conversely, to place a large capacitance on the common bus. This is undesirable because it slows down the ability of the one active device on the bus to force a low-to-high transition and requires more energy to accomplish a low-to-high transition.

For further explanation of the problem, in the normal bistate mode of operation pulldown transistor Q4 is required to conduct large amounts of current in sinking current from the load. It is therefore physically larger than most of the transistors in the circuit and thus has a large base-collector capacitance. The equivalent circuit showing the effect of this base-collector junction capacitance on transistor Q4 is illustrated in FIG. 1A where the equivalent feedback capacitance accompanying the junction is shown as $C_{bc}$ connected across the base and collector of transistor Q4. This relatively large base to collector junction capacitance $C_{bc}$ in the pulldown element transistor is known as the "Miller capacitance." When the voltage or potential at the output or common bus is rising, a significant amount of current $i_{bc}$ is generated proportional to the rate of change of voltage across the base collector capacitance $C_{bc}$. This current is also referred to as the "Miller current." Because of the high resistance of the squaring network, this high resistance represented by R4 in FIG. 1B, some of this Miller current flows into the base of Q4 designated in FIG. 1A as $i_b$ which base current is then multiplied by the gain $\beta$ of the transistor Q4 resulting in a large collector current $i_c = \beta i_b$ at Q4. This low AC impedance path to ground diverts current from the common bus, reducing the effectiveness of the one active element on the common bus for charging up the load capacitance. As a result, there is wasteful power consumption and retardation or delay in forcing low to high transitions at the common bus.

It is apparent that the current $i_b$ flowing into the base of Q4 must be eliminated to avoid these harmful effects of the Miller current. This base feedback current $i_b$ equals $i_{bc} - i_r$, that is the Miller current minus the portion diverted through resistance R4, and this could only be done if $i_r$ were equal to or greater than the Miller current $i_{cb}$. However, this condition that $i_r$ be greater than or equal to the Miller current cannot be achieved in the conventional circuit of FIG. 1 because resistance R4 must have such a large value in order to restrict current loss in the bistate mode when the phase splitter is providing base drive current to the pulldown element Q4. Because the Miller current across the Miller capacitance is proportional to the rate of change of potential across it, Q4 will therefore stay on until the voltage at the output stops changing from low to high. During this time, considerable current passes to ground from the common bus through the now conducting pulldown transistor wasting power.

Further background on transistor logic tristate output devices is found in copending U.S. patent application Ser. No. 005,929, filed Jan. 24, 1979, entitled "Transistor Logic Tristate Output With Reduced Power Dissipation," Steven N. Goodspeed, inventor; and copending Patent Application Ser. No. 005,928, filed Jan. 24, 1979, now U.S. Pat. No. 4,255,670, entitled "Transistor Logic Tristate Output With Feedback," Paul J. Griffith, inventor; both of said applications assigned to the assignee of the present invention. Further background on the problem of parasitic Miller capacitance and Miller feedback current is found in copending U.S. patent application Ser. No. 034,380, filed Apr. 30, 1979, entitled "Transistor Logic Output for Reduced Power Consumption and Increased Speed During Low to High Transition," Robert W. Bechdolt, inventor; and patent application Ser. No. 065,991, filed Aug. 13, 1979, entitled "Transistor Logic Output Device For Diversion of Miller Current," Paul J. Griffith, inventor; both said applications also assigned to the assignee of the present invention, namely Fairchild Camera Instrument Corporation, Mountain View, Calif.

SUMMARY OF THE INVENTION

It is therefore an object of the present invention to provide a new and improved transistor logic tristate output device with reduced output capacitance for common bus applications where a plurality of such devices are tied to the common bus, and one of the devices is active while the others are in the high impedance third state. The reduced output capacitance achieves reduced power consumption by inactive devices in the high impedance third state when one active device is forcing low to high potential changes at the common bus.

Another object of the invention is to provide a transistor logic tristate output gate which diverts parasitic Miller feedback current caused by low to high potential changes at the common bus away from the base of the pulldown element transistor means thereby avoiding the gain multiplication of current drain from the common bus by the pulldown element when the output device is in the high impedance third state.

Yet another object of the invention is to provide both active element and passive element arrangements for controlling Miller feedback current in the high impedance third state without otherwise interfering in the circuitry or impairing the function of the transistor logic output device in its bistate mode of operation.

In order to accomplish these results the present invention contemplates providing in a transistor logic tristate output gate or device the improvement comprising active or passive element arrangements coupled between the enable gate on the one hand and the base of the pulldown element transistor on the other affording a low impedance route to ground or low potential from the base of the pulldown element when the enable gate is at low potential and the output device is in the high impedance third state, thereby diverting Miller feedback current at the base of the pulldown element transistor means to ground; and wherein the coupling arrangements afford high impedance to current flow in the opposite direction toward the base of the pulldown element transistor thereby blocking current flow from the enable gate when the enable gate is at high potential and from any other high potential current source connected to the enable gate side of said coupling means.

In the preferred embodiment the invention contemplates providing active element discharge means defining a route to ground or low potential from the base of the pulldown element of high or low impedance according to the conducting state of the active element discharge means, and further means for controlling the conducting state of the active element according to the signal potential at the enable gate so that the active element affords a high impedance when the enable gate is at high potential and the output device is transmitting signals according to the bistate mode of operation and so that the active element affords a low impedance route to ground for Miller feedback current at the base of the pulldown element when the enable gate is at low potential and the output device is in the high impedance third state.

In particular, according to the preferred arrangement the active element discharge means comprises three active elements in a double inversion series coupling, the collector potential of the first active element in phase with the enable gate signal potential, the collector potential of the second active element out of phase with the enable gate potential, and the collector potential of the third active element in phase with the enable gate. A feature and advantage of this double inversion coupling arrangement is that it provides a low impedance path to ground from the base of the pulldown element when the enable gate is at low potential and the output device is in the high impedance third state, and affords a high impedance when the enable gate is at high potential and the output device is transmitting signals, otherwise isolating current sources from the base of the pulldown element.

In an alternative form of the invention the active element means coupled between the enable gate on the one hand and the base of the pulldown element on the other hand comprises a multiple emitter junction transistor having the collector thereof coupled to the base of the pulldown element, one emitter coupled to the enable gate, one emitter coupled to the input to the device, and a high potential current source coupled to the base thereof. A feature and advantage of this arrangement is that Miller current generated at the base of the pulldown element can find a route to ground or low potential when either the enable gate is at low potential or the input to the device is at low potential for under either circumstance the multiple emitter junction transistor is conducting. On the other hand, the multiple emitter transistor affords a high impedance at the base of the pulldown element whenever both the enable gate and input to the device are at high potential. Thus, harmful capacitive feedback Miller current will be diverted from the base of the pulldown element not only when the device is in the high impedance third state but also during the bistate mode of operation when the input signal is low and the output of the device is undergoing a transition from low to high potential.

Finally, in yet another embodiment of the invention, the means coupled between the enable gate on the one hand and the base of the pulldown element on the other hand, comprises a low forward impedance high backward impedance passive element such as a large surface area diode.

Other objects features and advantages of the present invention will become apparent in the following specification and accompanying drawings:

DESCRIPTION OF THE PREFERRED EMBODIMENT

Figure 1:
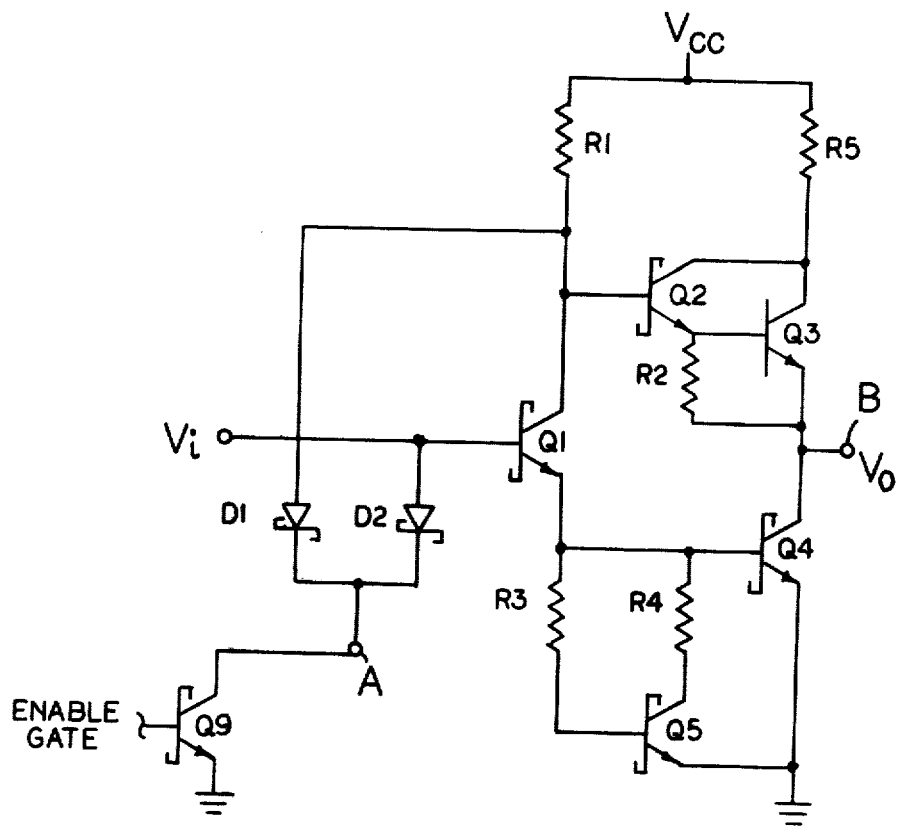
FIG. 1 is a schematic diagram of a typical transistor logic TTL tristate output gate or device according to the state of the art.
Figure 1A:
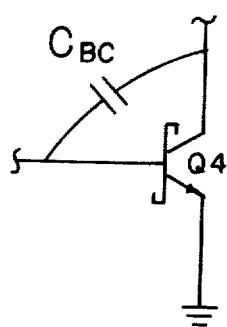
FIG. 1A is an equivalent circuit diagram of the pulldown element transistor with base-collector Miller capacitance.
Figure 1B:
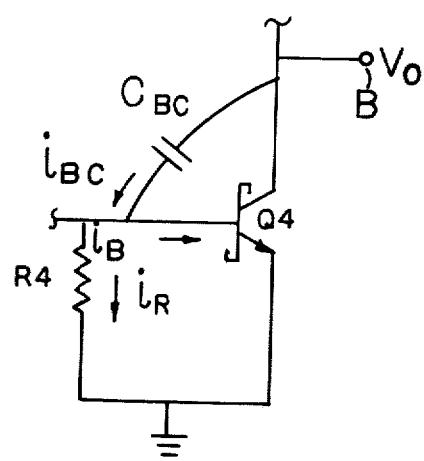
FIG. 1B is a further development of the equivalent circuit showing the movement of parasitic capacitive Miller feedback current to the base of the pulldown transistor element.
Figure 2:
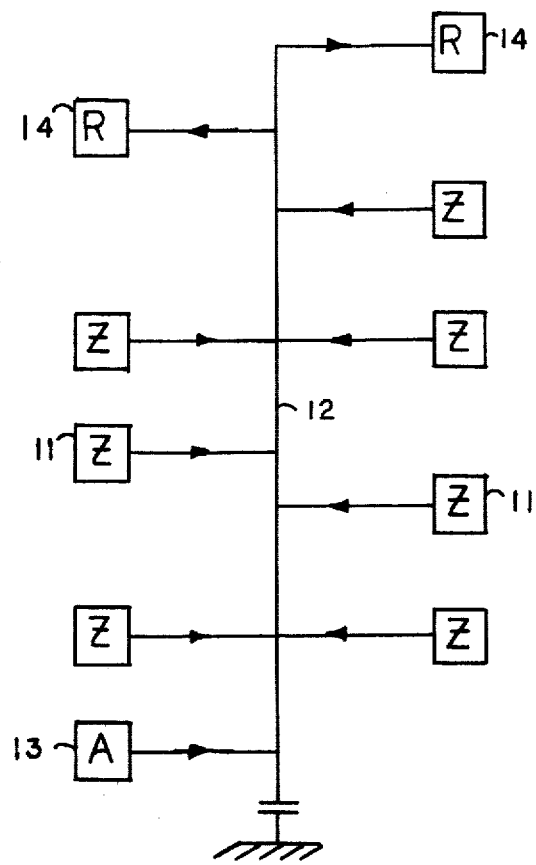
FIG. 2 is a block diagram of a system of a plurality of transistor logic tristate output devices tied together at their outputs to a common bus or conductor where all but one of the devices is in the high impedance third state (Z) while the remaining one gate (A) is active for transmitting binary signals in the bistate mode of operation to the common bus.
Figure 3A:
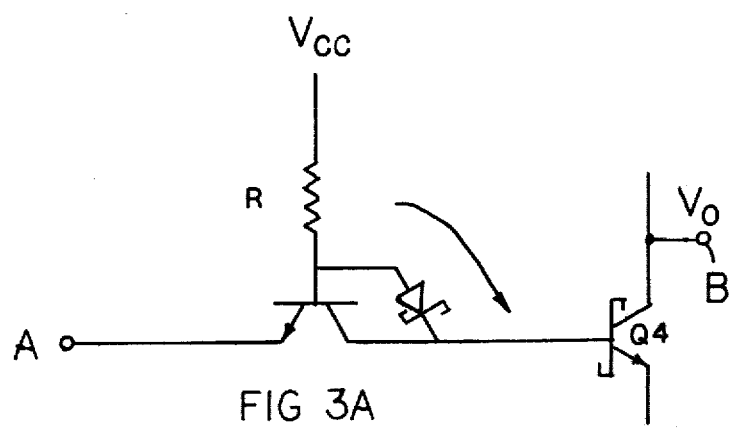
FIG. 3A is an equivalent circuit for a Schottky transistor demonstrating the respect in which such a transistor alone would be inoperative coupled into the circuit as an active element for discharge of parasitic Miller current.
Figure 3B:
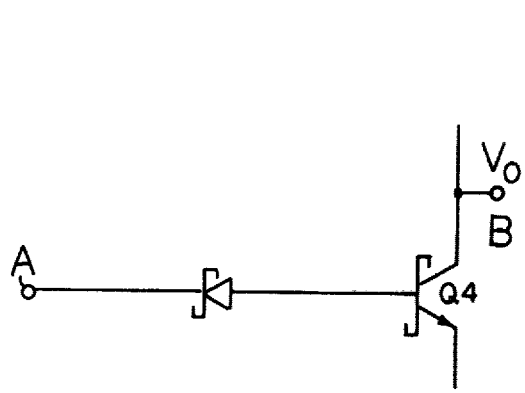
FIG. 3B is a schematic diagram of an alternative arrangement for discharging feedback Miller current using a passive element, in particular a low forward impedance high backward impedance diode.
Figure 3C:
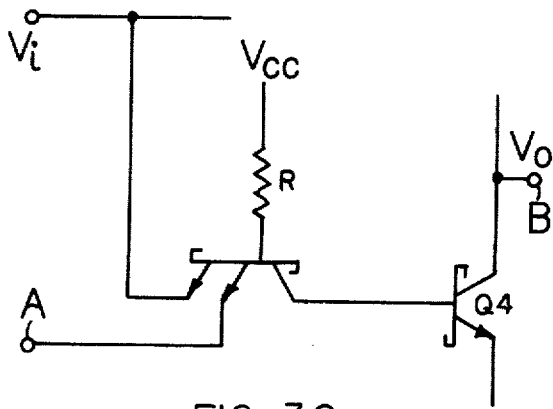
FIG. 3C is a schematic diagram of yet another form of the invention in which the active element for discharge of Miller current is a multi-emitter transistor.
Figure 3:
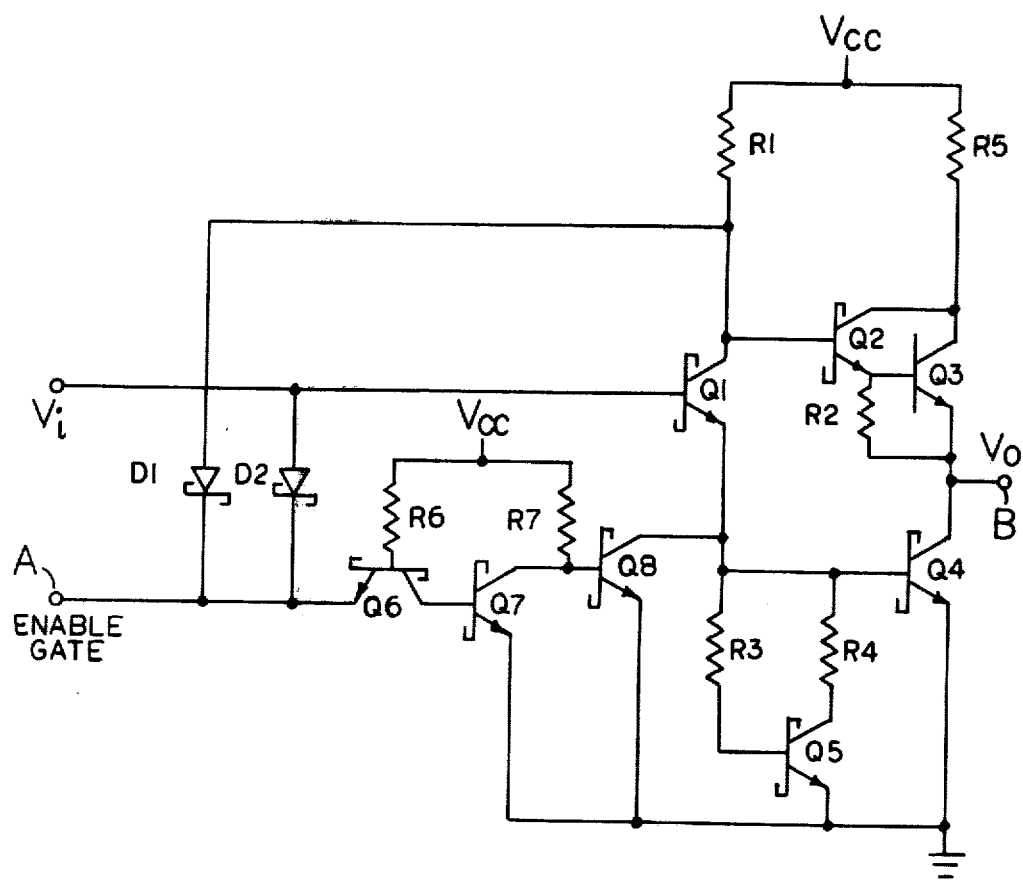
FIG. 3 is a schematic diagram of a TTL tristate output device in accordance with the present invention with means for discharge of capacitive Miller current occurring in the high impedance third state.

The transistor logic output device according to the present invention illustrated in FIG. 3 is a low power Schottky TTL gate which, but for the modifications of the present invention, operates in every respect like the device illustrated in FIG. 1. Therefore all of the portions for which the previous description for FIG. 1 is applicable are given the same component letters and numeral designations. To the circuit of FIG. 1, however, have been added transistors Q6, Q7 and Q8 and resistors R6 and R7. Transistor Q8, coupled between the base of pulldown transistor Q4 and ground affords an "active" means for diverting Miller feedback current from the base-collector junction capacitance of Q4 to ground. Furthermore, the active element Q8 normally in the nonconducting or high impedance state is controlled and switched to a conducting or low impedance state by the signal potential at the enable gate node A by way of transistors Q6 and Q7. Thus, Q8 is coupled at the base of Q4 and controlled by the enable gate as hereafter described.

When the enable gate is conducting and low potential appears at node A sinking current from the elements of the device to achieve the high impedance third state, the base-emitter junction of transistor Q6, added in accordance with the present invention, conducts current supplying base drive to transistor Q6. Transistor Q6 therefore becomes conducting from its collector to emitter, discharging the base of Q7 and turning off Q7. With Q7 non-conducting, the potential rises at the base of Q8 supplying base drive current and turning on Q8. With Q8 conducting through its collector to emitter, providing a low impedance path to ground, capacitive Miller feedback current from the junction capacitance $C_{bc}$ of pulldown transistor Q4 flows through the collector of Q8 rather than the base of Q4 preventing amplification of such base current by Q4. Thus, with the output device in the high impedance third state, feedback Miller current induced by voltage changes on the common bus, cannot drive the pulldown element transistor Q4 to conduction and drain current from the common bus through Q4. The high impedance tristate output device thus looks like a low or small capacitance from the common bus. The one active output device tied to the bus can now achieve low to high transitions much more rapidly while expending only a fraction of the energy and power required with configurations such as that illustrated in FIG. 1. The present invention thus adds to the high DC impedance of currently available tristate output devices, a high AC impedance in the third state.

When the enable gate is not conducting and high potential appears at node A, conduction by transistor Q6 is blocked. With Q6 not conducting, voltage rises at the base of Q7 supplying base drive current. Q7 becomes conducting through its collector lowering the potential at the base of Q8, sinking base drive current. Q8 therefore stops conducting blocking the route to ground through its collector with a high impedance. In this condition the TTL output device functions in its normal bistate mode transmitting binary signals by sourcing and sinking current at the output $V_o$.

From another perspective it can be seen that transistors Q6, Q7, and Q8 provide a double inversion of the tristate enable signal at node A, providing a low impedance route to ground at the base of Q4 when the enable gate and node A are at low potential and exhibiting a high impedance at the base of Q4 when a high potential signal appears at node A. At the same time, the isolation provided by three active elements in series in a double inversion coupling blocks any power from current sources to the base of Q4 when node A is at high potential and the input $V_i$ is low. Thus, when A is high and $V_i$ low, current cannot find a path to the base of Q4 as would otherwise be the case if only a single Schottky type transistor were used as the active element as illustrated in FIG. 3A. As shown in that diagram, the active element arrangement for discharging parasitic Miller current from the base of Q4 under control of the signals at the enable gate, comprises a single Schottky transistor rather than the double inversion sequence of three transistors illustrated in FIG. 3. The problem in the arrangement of FIG. 3A is immediately apparent in that when a high potential appears at node A blocking conduction by the transistor, current can leak from power supply $V_{cc}$ through the Schottky diode incorporated in the Schottky transistor and out the collector line to the base of Q4, driving Q4 to conduction when it should be non-conducting. That is, when A is high and $V_i$ low, the output $V_o$ should be high and pulldown transistor Q4 not conducting. The double inversion sequence of three active elements incorporated in the embodiment of the present invention illustrated in FIG. 3 avoids this dilemma. Thus, the base of Q4 is isolated from power sources in the bistate mode of operation if A is high and $V_i$ low.

The active element coupling of the present invention for discharging undesirable Miller current provides a potential at the base of Q4 in phase with the signal at node A of the enable gate. This is accomplished by double inversion. The collector of Q6 is in phase with the signal at node A, the collector of potential of Q7 is inverted and out of phase with the signal at A, while the potential at the collector of Q8 is again inverted and in phase with A. In other words, when the enable gate is conducting through its pulldown transistor Q9, Q6 and Q8 in phase with the enable gate transistor Q9 are also conducting while Q7 is not. When the enable gate is not conducting through its pulldown transistor Q9, transistors Q6 and Q8 in phase with Q9 are also not conducting while Q7 is. By this double inversion arrangement there is no interference in the normal bistate operation of the output device during transitions between low and high.

Ideally the Miller current discharge means coupled between the base of pulldown transistor Q4 and the enable gate would be a passive element such as a diode with high back impedance and low forward impedance as illustrated in FIG. 3B. It is the use of active elements for this purpose which presents the problem of an accompanying power supply which must then be isolated from the base of Q4 when A is high and $V_i$ is low. The passive element diode coupled as shown in FIG. 3B could provide a low impedance path to ground from the base of Q4 which is in phase with the enable gate signal at A, and can do so without an accompanying power supply and without interferring in the normal bistate operation of the device. For use of such a passive element diode coupling however, the forward impedance must be low, in the order of 0.2–0.3 volts in order to prevent conduction by Q4. The standard integrated circuit diode in TTL gates however is in the order of 0.4–0.6 volts. The impedance of the diode can be reduced however by increasing the size of the diode dimensions, i.e. the area of the junction, to achieve a 0.2–0.3 voltage drop across the junction diode.

Yet another form of the invention is illustrated in FIG. 3C where a multiple emitter transistor is incorporated as the active element under control of the enable gate to discharge unwanted Miller current from the base of Q4 during the high impedance third state. As shown in that diagram, one of the multiple emitters is coupled to the input $V_i$ and one to the enable gate at node A. The collector is coupled to the base of Q4 while the base is connected to the power supply $V_{cc}$. By this arrangement collector current at the multi-emitter transistor collector can flow out either emitter if either A or $V_i$ is low, thereby isolating the base of Q4 from current delivered by $V_{cc}$. One problem with this arrangement is that the multi-emitter active element transistor can perform this function only if the low level potential signal at the input is sufficiently low to draw current through the emitter, e.g. less than 0.6 volts. Since input lows for prevailing circuits is generally in the order of 1.0 volts, relative voltage levels must be adjusted to accommodate this approach.

While the preferred embodiments of the present invention have been described with reference to particular examples it is apparent that they have application in a wide variety of circuits including low power Schottky, regular Schottky, and isoplanar technologies, of the kind, for example further described in the article "Oxide Isolation Builds a Better Schottky TTL" by Bob Bechdolt, Dave Ferris, and Paul Griffith of Fairchild Semiconductor Digital Division, South Portland, Me., division of Fairchild Camera and Instrument Corp., Mountain View, Calif., published in the Mar. 1, 1979, issue of *Electronics*. Further account of technologies for implementing the present invention is found in the Fairchild *TTL Data Book* of Fairchild Camera and Instrument Corp., 464 Ellis Street, Mountain View, Calif., 94042, copyright 1978.

I claim:

1. In a transistor logic tristate output device of the type suitable for applications on a common bus, comprising an input and an output for transmitting binary data signals of high and low potential in the bistate mode of operation, pullup element for sourcing current to the output from high potential, pulldown element for sinking current from the output to low potential, phase splitter element coupled at the input to control the pullup and pulldown elements in response to signals at the input, said elements comprising junction transistor means, and an enable gate to afford a high impedance third state at the output, said pulldown element transistor means characterized by relatively large base-collector junction capacitance resulting in undesirable parasitic capacitive Miller current to the base of the pulldown element transistor means caused by low to high potential changes on the common bus at the output of the device, the improvement for diverting and discharging the base-collector capacitive feedback Miller current to prevent conduction by the pulldown element when the device is in the high impedance third state comprising:

means coupled between the enable gate on the one hand and the base of the pulldown element transistor means on the other affording a low impedance route to ground from the base of the pulldown element when the enable gate is at low potential and the output device is in the high impedance third state, thereby diverting any Miller feedback current at the base of the pulldown element transistor means to ground;

said coupling means between the enable gate and the base of the pulldown element affording high impedance to current flow in the opposite direction toward the base of the pulldown element transistor means thereby blocking current flow from the enable gate when the enable gate is at high potential and from any other high potential current source connected to the enable gate side of said coupling means; said coupling means coupled between the enable gate and the base of the pulldown element without connection to the base of the phase splitter element or other element of the device and therefore without incapacitating the phase splitter element or diverting current from any other element of the device.

2. A device with reduced output capacitance as set forth in claim 1 wherein said means coupled between the enable gate on the one hand and the base of the pulldown element on the other hand comprises active element means defining a route to ground or low potential from the base of the pulldown element, of high or low impedance according to the conducting state of the active element means;

and means controlling the conducting state of said active element means according to the signal potential at the enable gate whereby the active element means affords a high impedance when the enable gate is at high potential and the output device is transmitting signals and affords a low potential route to ground for Miller feedback current at the base of the pulldown element when the enable gate is at low potential and the output device is in the high impedance third state.

3. A device with reduced output capacitance as set forth in claim 2 wherein said active element means coupled between the enable gate on the one hand and the base of the pulldown element on the other hand comprises a sequence of three active elements in a double inversion series coupling, the collector potential of the first active element in phase with the enable gate potential, the collector potential of the second active element out of phase with the enable gate potential, and the collector potential of the third active element in phase with the enable gate potential whereby the third active element affords a low impedance path to ground from the base of the pulldown element when the enable gate is at low potential and the output device is in the high impedance third state, affords a high impedance when the enable gate is at high potential and the output device is transmitting signals, and otherwise isolates current sources from the base of the pulldown element.

4. A device with reduced output capacitance as set forth in claim 2 wherein said active element means coupled between the enable gate on the one hand and the base of the pulldown element on the other hand comprises a multiple emitter junction transistor having the collector thereof coupled to the base of the pulldown element, one emitter coupled to the enable gate, and one emitter coupled to the input to the device, a high potential source coupled to the base thereof, whereby the multiple emitter junction transistor is conducting and Miller current generated at the base of the pulldown element can find a route to ground or low potential when either the enable gate is at low potential or the input to the device is at low potential and wherein the multiple emitter active element affords a high impedance at the base of the pulldown element whenever both the enable gate and input to the device are at high potential.

5. A device with reduced output capacitance as set forth in claim 1 wherein said means coupled between the enable gate on the one hand and the base of the pulldown element on the other hand comprises low forward impedance high backward impedance passive element means.

6. A device with reduced output capacitance as set forth in claim 5 wherein said passive element means coupled between the enable gate on the one hand and the base of the pulldown element on the other hand comprises a low forward impedance relatively large surface area junction diode.

7. In a transistor logic tristate output device of the type suitable for applications on a common bus comprising an input and an output for transmitting binary data signals of high and low potential in the bistate mode of operation, pullup element for sourcing current to the output from high potential, pulldown element for sinking current from the output to low potential, phase splitter element coupled at the input to control the pullup and pulldown elements in response to signals at the input, said elements comprising junction transistor means, and an enable gate to afford a high impedance third state at the output, said pulldown element transistor means characterized by base-collector junction capacitance resulting in undesirable parasitic capacitive feedback Miller current to the base of the pulldown element transistor means caused by low to high potential changes on the common bus at the output of the device, the improvement for diverting and discharging the base-collector capacitive feedback Miller current comprising:

active element discharge transistor means coupled between the base of the pulldown element transistor means and ground or low potential normally defining a high impedance path when the active element transistor means is non-conducting;

means for coupling said active element means to follow changes in potential at the enable gate of the device to drive the active element means to conduction and provide a low impedance path for diverting and discharging capacitive feedback Miller current from the base of the pulldown element when the device is in the high impedance third state, thereby reducing output capacitance and capacitive coupling to the common bus in the high impedance third state, said active element discharge transistor means and means for coupling said active element means comprising a sequence of at least three active element transistors in a double inversion coupling thereby isolating current sources from the base of the pulldown element when the pulldown element is not conducting.

8. In a transistor logic tristate output device of the type suitable for applications on a common bus comprising an input and an output for transmitting binary data signals of high and low potential, pullup element for sourcing current to the output from high potential, pulldown element for sinking current from the output to low potential, phase splitter element coupled at the input to control the pullup and pulldown elements in response to signals at the input, said elements comprising junction transistor means, and enable gate signal input means to afford a high impedance third state at the output, said pulldown element transistor means characterized by base-collector junction capacitance resulting in undesirable parasitic capacitive feedback Miller current to the base of the pulldown element transistor means caused by low to high potential changes on the common bus at the output of the device, the improvement for diverting and discharging the base-collector capacitive feedback Miller current comprising:

active element discharge transistor means coupled between the base of the pulldown element transistor means, and the enable gate and the device input, normally defining a high impedance path when the active element transistor means is non-conducting, said active element transistor means coupled to follow changes in potential at the input of the device and at the enable gate to induce conduction and provide a low impedance path for diverting and discharging Miller current from the base of the pulldown element when either the enable gate or device input is at low potential, thereby enhancing the speed of turnoff of the pulldown element in the bistate mode of operation and reducing power consumption by the pulldown element in the high impedance third state.

9. An improved transistor logic output device suitable for applications on a common bus as set forth in claim 8 wherein said active element discharge transistor means comprises at least one multiple emitter transistor.

10. A system of a plurality of transistor logic tristate output devices each of the type having an input and an output for transmitting data signals of high and low potential in a bistate mode of operation, pullup element for sourcing current to the output from high potential, pulldown element for sinking current from the output to low potential, phase splitter element coupled at the input to control the pullup and pulldown elements, said elements comprising junction transistor means, and an enable gate to afford a high impedance third state at the output of the device, said plurality of devices tied together at their outputs on a common bus or conductor and wherein during operation of the system all but one of the output devices is in the high impedance third state while the remaining one is active for transmitting binary signals in the bistate mode of operation, the pulldown element junction transistor means of each said devices characterized by base-collector junction capacitance resulting in undesirable parasitic capacitive feedback Miller current to the base of the pulldown element of devices in the high impedance third state when the one active element forces a low to high potential change on the common bus, the improvement for diverting and discharging the base-collector capacitive Miller feedback current from devices in the high impedance third state for maintaining high impedance and preventing pulldown elements from sinking current from the common bus comprising:

each said tristate output device including means coupled between the enable gate on the one hand and the base of the pulldown element on the other hand affording a low impedance route to ground from the base of the pulldown element when the enable gate is at low potential and affording a high impedance to current flow in the opposite direction toward the base of the pulldown element transistor means; said coupling means coupled between the enable gate and the base of the pulldown element without connection to the base of the phase splitter element or other element of the device and therefore without incapacitating the phase splitter element or diverting current from any other element of the device.

11. A system of a plurality of transistor logic tristate output devices as set forth in claim 10 wherein said means coupled between the enable gate on the one hand and the base of the pulldown element on the other hand comprises active element discharge transistor means and means for controlling the conducting state of said active element means in response to signal potentials at the enable gate.

12. A system of a plurality of transistor logic tristate output devices as set forth in claim 11 wherein said active element discharge transistor means and means for controlling comprises a sequence of at least three active element transistors in a double inversion coupling thereby isolating current sources from the base of the pulldown element when the pulldown element is not conducting.

13. A system of a plurality of transistor logic tristate output devices as set forth in claim 10 wherein said means coupled between the enable gate on the one hand and the base of the pulldown element on the other hand comprises a low forward impedance high backward impedance passive element.

14. A system of a plurality of transistor logic tristate output devices as set forth in claim 13 wherein said passive element comprises a low forward impedance relatively large surface area junction diode.

15. A system of a plurality of transistor logic tristate output devices as set forth in claim 11 wherein the active element discharge transistor means comprises a multiple emitter transistor means.

* * * * *